(12) United States Patent
Thomas et al.

(10) Patent No.: US 12,381,129 B2
(45) Date of Patent: Aug. 5, 2025

(54) LINER-FREE THROUGH-SILICON-VIAS FORMED BY SELECTIVE METAL DEPOSITION

(71) Applicant: GlobalFoundries U.S. Inc., Malta, NY (US)

(72) Inventors: David Thomas, Richmond, VT (US); Cody Soule, Burlington, VT (US); John G. Twombly, Fairfax, VT (US); Michael Brigham, Bolton, VT (US); Bruce Porth, Jericho, VT (US); Vivekanand Kalaparthi, Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 624 days.

(21) Appl. No.: 17/705,458

(22) Filed: Mar. 28, 2022

(65) Prior Publication Data

US 2023/0307321 A1    Sep. 28, 2023

(51) Int. Cl.
*H01L 23/48* (2006.01)
*H01L 21/768* (2006.01)
*H01L 23/532* (2006.01)

(52) U.S. Cl.
CPC ...... *H01L 23/481* (2013.01); *H01L 21/76898* (2013.01); *H01L 23/53257* (2013.01)

(58) Field of Classification Search
CPC ............. H01L 23/481; H01L 21/76898; H01L 23/53257; H01L 21/28562; H01L 21/28556; H01L 21/28568; C23C 16/045; C23C 16/08
See application file for complete search history.

(56) References Cited

U.S. PATENT DOCUMENTS

| | | | |
|---|---|---|---|
| 4,746,621 A | 5/1988 | Thomas et al. | |
| 4,907,066 A | 3/1990 | Thomas et al. | |
| 8,153,520 B1 | 4/2012 | Chandrashekar et al. | |
| 8,587,131 B1 | 11/2013 | Huang et al. | |
| 8,709,948 B2 | 4/2014 | Danek et al. | |
| 9,397,046 B1 * | 7/2016 | Sharangpani | H10B 43/35 |
| 11,631,769 B2 | 4/2023 | Kim et al. | |
| 2012/0302071 A1 | 11/2012 | Lee | |

(Continued)

FOREIGN PATENT DOCUMENTS

| | | |
|---|---|---|
| DE | 102021121297 A1 | 3/2022 |
| KR | 10-2016-0135672 A | 11/2016 |

(Continued)

OTHER PUBLICATIONS

Taiwan Intellectual Property Office, Office Action and Search Report issued in Taiwaneese Patent Application No. 112107254 on Apr. 19, 2024; 9 pages.

(Continued)

*Primary Examiner* — Jonathan Han
(74) *Attorney, Agent, or Firm* — Thompson Hine LLP; Anthony Canale

(57) ABSTRACT

Structures for a through-silicon via and methods of forming a structure for a through-silicon via. The structure includes a substrate having a trench and surfaces that border the trench. The structure further includes a through-silicon via having a layer inside the trench. The layer is in direct contact with the surfaces of the substrate.

20 Claims, 4 Drawing Sheets

(56) References Cited

U.S. PATENT DOCUMENTS

2015/0056803 A1   2/2015  Chandrashekar et al.
2019/0326168 A1*  10/2019 Yang ................. H01L 21/76879

FOREIGN PATENT DOCUMENTS

KR   10-2021-0111017 A   9/2021
KR   10-2021-0158419 A   12/2021

OTHER PUBLICATIONS

Korean Intellectual Property Office, Notice of Preliminary Rejection issued in Korean Patent Application No. 10-2023-0024245 on Sep. 11, 2024; 16 pages.
Taiwan Intellectual Property Office, Office Action and Search Report issued in Taiwanese Patent Application No. 112107254 on Oct. 23, 2024; 9 pages.
Korean Intellectual Property Office, Notice of Final Rejection issued in Korean Patent Application No. 10-2023-0024245 on May 7, 2025; 8 pages.
German Patent and Trademark Office, First Office Action issued in German Patent Application No. 102023103760.9 on Jul. 1, 2025; 10 pages.

\* cited by examiner

LINER-FREE THROUGH-SILICON-VIAS FORMED BY SELECTIVE METAL DEPOSITION

BACKGROUND

This disclosure relates to semiconductor device fabrication and integrated circuits and, more specifically, to structures for a through-silicon via and methods of forming a structure for a through-silicon via.

Three-dimensional integrated circuits with through-silicon vias have emerged as a technique for supplying vertical interconnections in the semiconductor manufacturing industry. Through-silicon-via technology is of interest, for example, in creating three-dimensional chip stacks. Stacking chips in a three-dimensional chip stack shortens signal transmission distances for chip-to-chip communications and promotes a large increase in the number of inter-chip links.

A through-silicon via may be formed by a process that forms a deep trench in a substrate, deposits a nucleation liner on the sidewalls of the deep trench, and then deposits tungsten to fill the deep trench. The nucleation liner, which is arranged between the deposited tungsten and the sidewalls of the deep trench, may include, for example, a bilayer of titanium and titanium nitride. The nucleation liner is annealed at 600° C. following its formation. The through-silicon-via formation process imparts significant stress to the substrate, which may result in bowing and breakage during subsequent processing, such as during chemical-mechanical polishing that removes deposited tungsten and nucleation liner from the substrate field surrounding the deep trench and planarizes the through-silicon via.

Improved structures for a through-silicon via and methods of forming a structure for a through-silicon via are needed.

SUMMARY

In an embodiment of the invention, a structure includes a substrate having a trench and a plurality of surfaces that border the trench. The structure further includes a through-silicon via having a layer inside the trench. The layer is in direct contact with the surfaces of the substrate.

In an embodiment of the invention, a method of forming a through-silicon via is provided. The method includes forming a trench in a substrate that includes a plurality of surfaces that border the trench, and forming a layer inside the trench to define the through-silicon via. The layer directly contacts the plurality of surfaces of the substrate.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
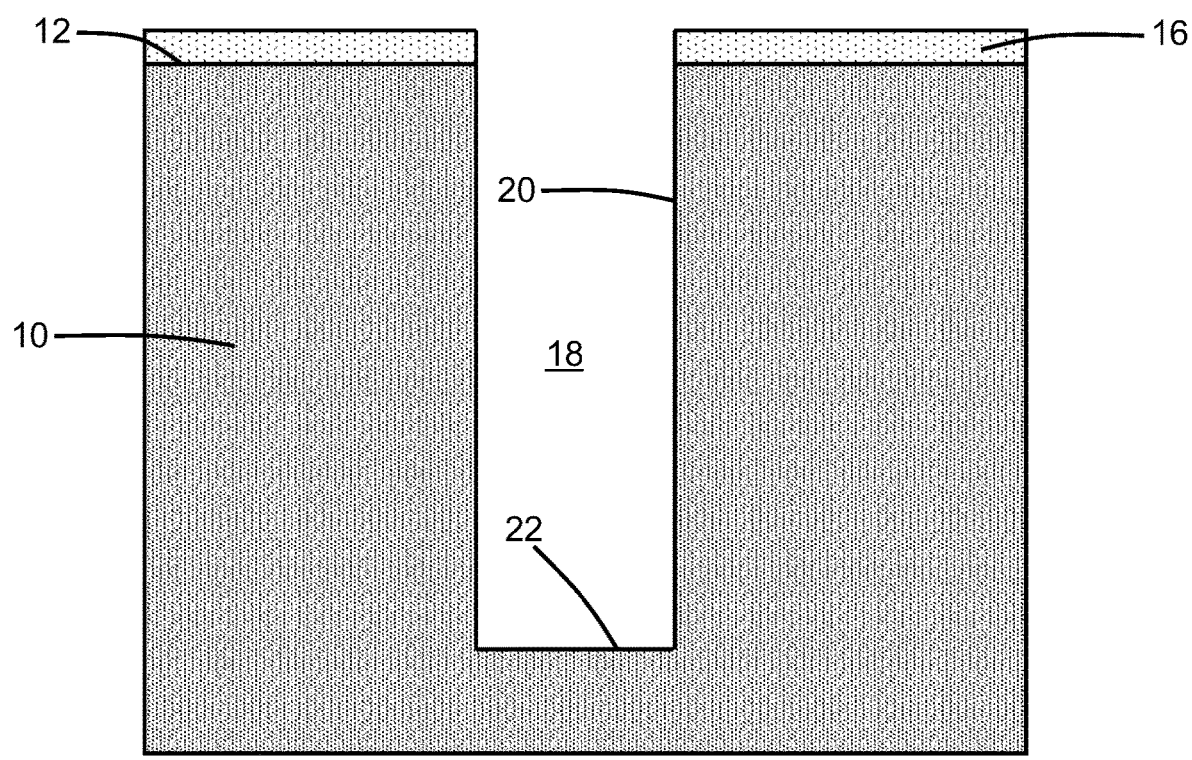
FIGS. 1-4 are cross-sectional views of a structure at successive fabrication stages of a processing method in accordance with embodiments of the invention.

With reference to FIG. 1 and in accordance with embodiments of the invention, a hardmask 16 is formed on a front surface 12 of a substrate 10. The substrate 10 may contain a single-crystal semiconductor material, such as single-crystal silicon. In an embodiment, the substrate 10 may be a bulk substrate comprising a semiconductor material, such as single-crystal silicon.

The hardmask 16 may include a pad layer comprised of a dielectric material, such as borophosphosilicate glass or silicon dioxide, and may be patterned by lithography and etching processes to define an opening that exposes a surface area of the substrate 10. In that regard, the hardmask 16 may be patterned using an etch mask formed by lithography. The etch mask may include a photoresist layer applied by a spin-coating process, pre-baked, exposed to light projected through a photomask, baked after exposure, and developed with a chemical developer to define the opening to be formed in the hardmask 16. An etching process, such as a reactive ion etching process, may then be used to remove portions of the pad layer exposed by the opening in the etch mask, which is subsequently stripped, to define the opening in the hardmask 16.

A trench 18 may be formed that penetrates from the front surface 12 of the substrate 10 to a given depth into the substrate 10. In an embodiment, the depth of the trench 18 may range from about 10 microns to about 150 microns, and the width of the trench 18 may range from about 2 microns to about 6 microns. The trench 18 may be formed at the location of the opening in the hardmask 16 by an etching process with reliance on the hardmask 16 as an etch mask. The opening in the hardmask 16 may be slightly wider than the trench 18 in order to promote the subsequent layer deposition inside the trench 18 to form a through-silicon via. The substrate 10 includes surfaces 20, 22 respectively bordering and coextensive with the sidewall and bottom of the trench 18.

Figure 2:
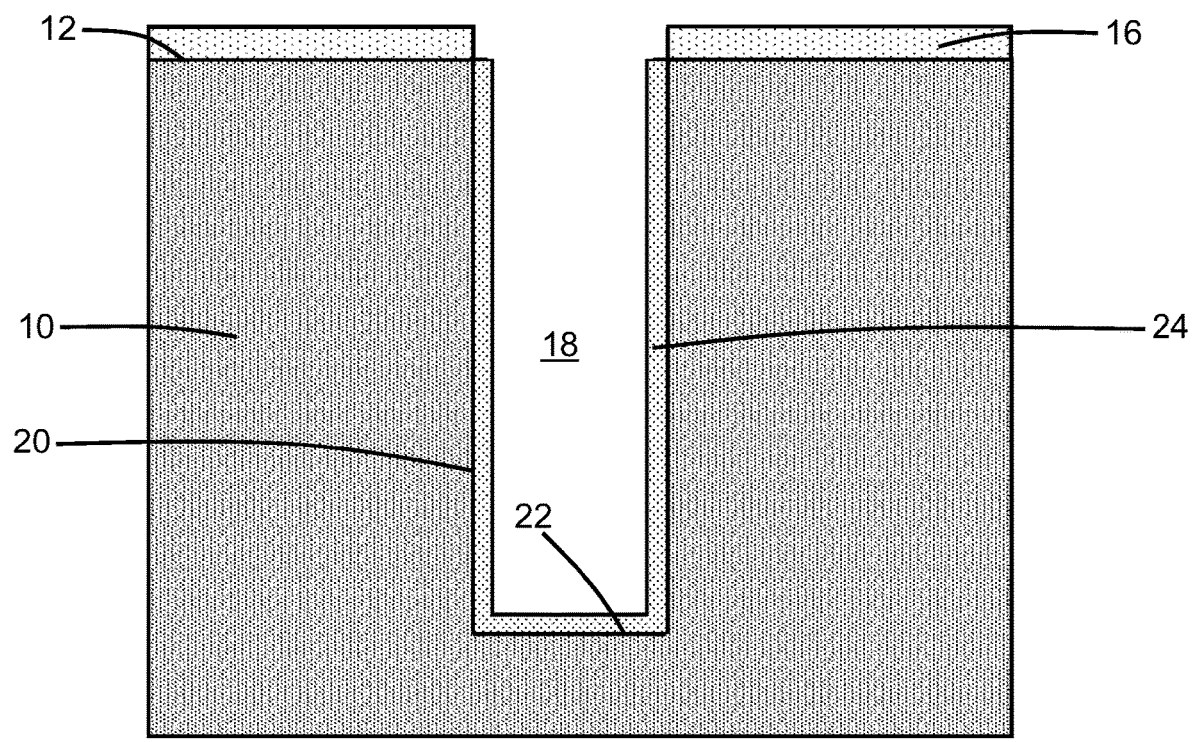

With reference to FIG. 2 in which like reference numerals refer to like features in FIG. 1 and at a subsequent fabrication stage, a layer 24 containing a metal is formed inside the trench 18. In contrast to conventional deposition processes used to form a through-silicon via, a liner (e.g., an adhesion liner, a barrier liner, a nucleation liner, or a combination thereof (e.g., a bilayer of titanium and titanium nitride)) is not pre-applied to the surfaces 20, 22 bordering the trench 18 after forming the trench 18 and before forming the layer 24. Hence, the subsequently-formed through-silicon via is free of a liner between the layer 24 and the surfaces 20, 22 of the substrate 10. Instead, the layer 24 directly contacts the surfaces 20, 22 of the substrate 10.

The layer 24 may be formed with the hardmask 16 on the front surface 12 of the substrate 10. In an embodiment, the layer 24 may be formed by a selective deposition process in which the constituent metal nucleates and forms on the surfaces 20, 22 of the substrate 10, but not on the dielectric material of the hardmask 16. In an embodiment, the deposited metal may be tungsten that is selectively deposited on the surfaces 20, 22 of the substrate 10 by a deposition process that employs a tungsten-containing precursor and a reducing agent as reactant gases in a chemical vapor deposition process. In an embodiment, the deposited metal may be tungsten that is selectively deposited on the surfaces 20, 22 of the substrate 10 by a deposition process that employs tungsten hexafluoride and hydrogen as reactant gases in a chemical vapor deposition process. The gas mixture of reactant gases employed in the selective deposition process lacks silane, which is present in conventional deposition processes. Process conditions may include a substrate temperature in a range of about 395° C. to about 420° C., a flow rate for tungsten hexafluoride ranging from about 300 standard cubic centimeters per minute (sccm) to about 400 sccm, a chamber pressure of approximately 40 torr, and a flow rate for hydrogen ranging from about 5,500 sccm to about 9,000 sccm.

The layer 24 is deposited in multiple stages, and each stage of the multi-stage deposition process is characterized by a different reduction reaction. In an embodiment, the multi-stage deposition process may be fully selective such that tungsten does not deposit on the hardmask 16. In an embodiment, the multi-stage deposition process may be substantially selective such that tungsten deposits on the hardmask 16 but as a significantly thinner layer in contrast to the thickness of tungsten that would be deposited by a non-selective deposition process.

The layer 24 is formed initially by a reduction reaction in which the tungsten hexafluoride reacts with the semiconductor material (e.g., silicon) of the substrate 10 to preferentially deposit solid tungsten on the surfaces 20, 22 of the trench 18. Silicon tetrafluoride is formed by the silicon reduction reaction as a waste byproduct. The layer 24 thickens as the silicon reduction reaction proceeds. However, the silicon reduction reaction is self-limited by the ability of tungsten hexafluoride species to diffuse through the increasing thickness of the layer 24 to the substrate 10. An initial portion of the layer 24 forms on the surfaces 20, 22 and, as the thickness increases, the initial portion of the layer 24 eventually blocks significant diffusion of tungsten hexafluoride to the surfaces 20, 22.

Figure 3:
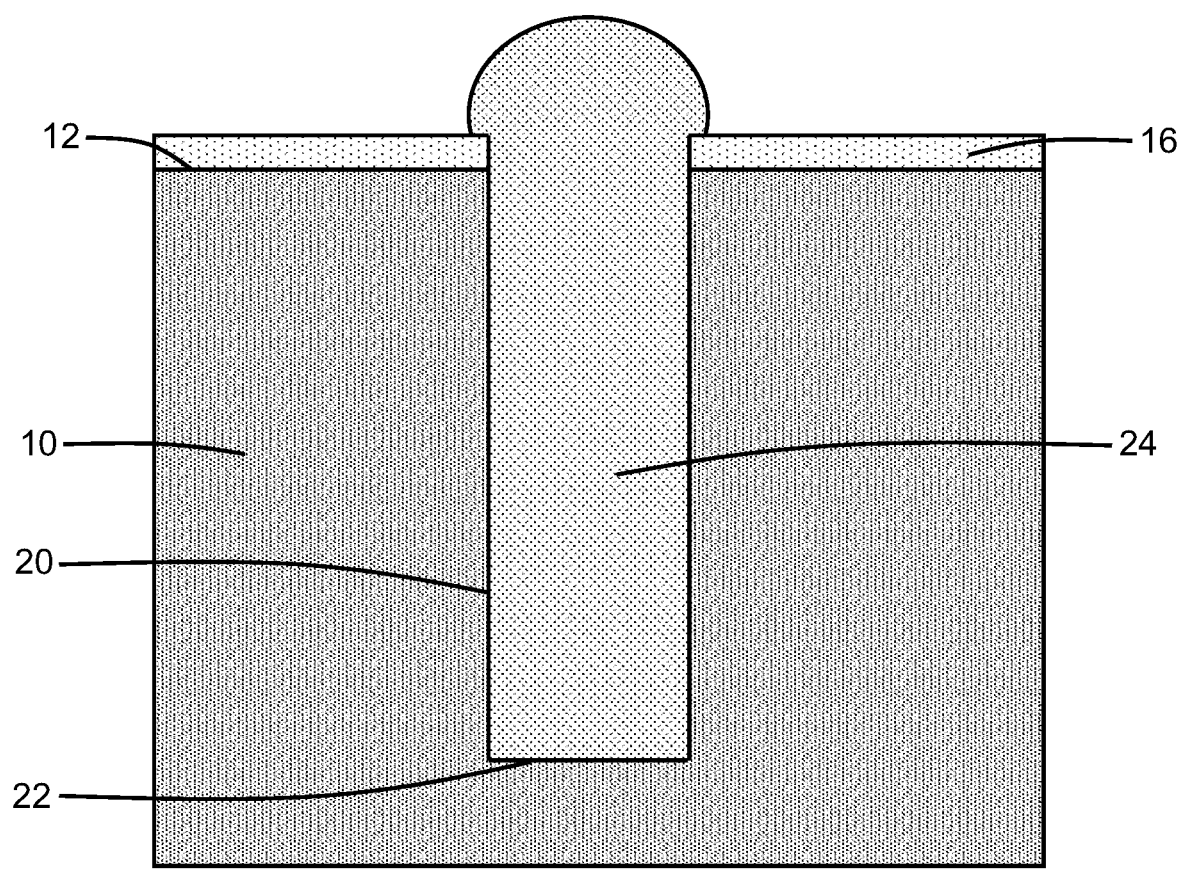

With reference to FIG. 3 in which like reference numerals refer to like features in FIG. 2 and at a subsequent fabrication stage, the formation of the layer 24 inside the trench 18 continues without interrupting the deposition process and with the same deposition conditions as used to form the initial portion of the layer 24. However, the reduction reaction forming the layer 24 changes. Specifically, the reduction reaction transitions such that the tungsten hexafluoride reacts with the hydrogen in the reactant gases to preferentially continue to deposit solid tungsten inside the trench 18. Hydrogen fluoride is formed by the hydrogen reduction reaction as a waste byproduct.

The hydrogen reduction reaction produces an inner portion of the layer 24 that is positioned inside the outer portion of the layer 24 (FIG. 2) formed by the silicon reduction reaction. In an embodiment, the layer 24 may fill the trench 18 following the conclusion of the hydrogen reduction reaction portion of the deposition process. In an embodiment, the layer 24 may substantially fill the trench 18. In an embodiment, the layer 24 may be free of seams. The layer 24 may be fully surrounded below the front surface 12 of the substrate 10 by the surfaces 20, 22 of the substrate 10. The layer 24 may include an upper portion that projects out of the trench 18 as an overflow, which is removed during a subsequent polishing process.

The metal (e.g., tungsten) of the layer 24 may be polycrystalline, and the layer 24 may include the outer portion formed by the silicon reduction reaction and the inner portion formed by the hydrogen reduction reaction. In an embodiment, the inner and outer portions of the layer 24 may be characterized by different average grain sizes. In an embodiment, the initial outer portion of the layer 24 may be characterized by smaller grains, and the inner portion of the layer 24 may be characterized by larger grains. As a result, the layer 24 includes an outer portion characterized by an average grain size, and an inner portion (surrounded by the outer portion) that is characterized by an average grain size that is greater (i.e., larger) than the average grain size of the inner portion. The surfaces 20, 22 may define respective interfaces between the semiconductor material (e.g., silicon) of the substrate 10 and the metal (e.g., tungsten) of the layer 24.

Figure 4:
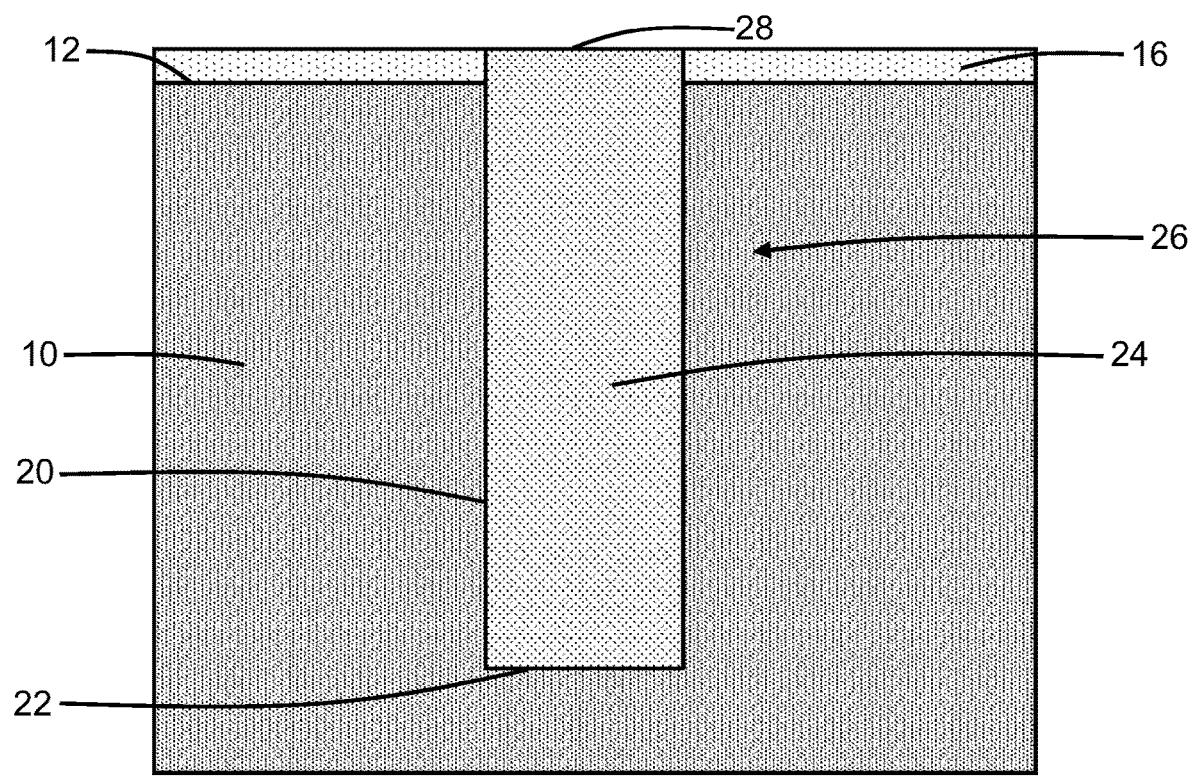

With reference to FIG. 4 in which like reference numerals refer to like features in FIG. 3 and at a subsequent fabrication stage, the layer 24 may be planarized by, for example, a chemical-mechanical polishing process, to be coplanar with the hardmask 16. The planarized layer 24 inside the trench 18 defines a through-silicon via 26 having a tip at the bottom of the trench 18 and a top surface 28 that is planar or substantially planar. In an embodiment, the through-silicon via 26 may be unitary. In an embodiment, the through-silicon via 26 may lack any other layers other than the layer 24. In an embodiment, the through-silicon via 26 may be a single piece of continuous material. In an embodiment, the through-silicon via 26 may exclusively include the metal of the layer 24. In an embodiment, the substrate 10 may be subsequently thinned from the back surface to reveal the tip of the layer 24.

The through-silicon-via formation process is simplified because the conventional nucleation liner and its post-deposition 600° C. anneal are eliminated. The through-silicon via 26 may be less likely to include a seam because of the deposition process used to form the layer 24, which may reduce the incidence of trapped contaminants in, for example, a seam that later can escape to cause defects. The deposition process may speed planarization by chemical-mechanical polishing because the layer 24 is either not deposited on the exposed surface of the hardmask 16 or only deposits as a thin layer on the exposed surface of the hardmask 16. The absence of a liner may also reduce the time required for chemical-mechanical polishing.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature with either direct contact or indirect contact.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a substrate including a trench and a plurality of surfaces that border the trench; and
a through-silicon via including a layer inside the trench, the layer in direct contact with the plurality of surfaces of the substrate, the layer including a first portion adjoining the plurality of surfaces and a second portion that is positioned inside the first portion, the first portion of the layer having a first average grain size, and the second portion of the layer having a second average grain size that differs from the first average grain size.

2. The structure of claim 1 wherein the second average grain size is greater than the first average grain size.

3. The structure of claim 1 wherein the layer comprises a metal.

4. The structure of claim 1 wherein the layer comprises tungsten.

5. The structure of claim 1 wherein the layer exclusively contains tungsten.

6. The structure of claim 1 wherein the through-silicon via is free of a liner between the layer and the plurality of surfaces of the substrate.

7. The structure of claim 6 wherein the layer comprises tungsten.

8. The structure of claim 6 wherein the layer exclusively contains tungsten.

9. The structure of claim 1 wherein the through-silicon via is a single piece of continuous tungsten.

10. The structure of claim 1 wherein the through-silicon via exclusively includes the layer.

11. The structure of claim 1 wherein the trench includes a sidewall and a bottom, and the plurality of surfaces of the substrate are coextensive with the sidewall and the bottom of the trench.

12. The structure of claim 11 wherein the substrate is a bulk semiconductor substrate comprising single-crystal silicon.

13. The structure of claim 1 wherein the layer is surrounded by the plurality of surfaces of the substrate.

14. The structure of claim 1 wherein the through-silicon via is unitary.

15. The structure of claim 1 wherein the substrate comprises silicon, the layer comprises tungsten, and the plurality of surfaces define respective interfaces between the silicon of the substrate and the tungsten of the layer.

16. A method of forming a through-silicon via, the method comprising:
forming a trench in a substrate, wherein the substrate includes a plurality of surfaces that border the trench; and
forming a layer inside the trench to define the through-silicon via, wherein the layer directly contacts the plurality of surfaces of the substrate,
wherein the layer includes a first portion adjoining the plurality of surfaces, a second portion that is positioned inside the first portion, the first portion of the layer has a first average grain size, and the second portion of the layer has a second average grain size that is differs from the first average grain size.

17. The method of claim 16 wherein the layer comprises tungsten formed by a selective deposition process using tungsten hexafluoride and hydrogen as reactant gases.

18. The method of claim 16 wherein the layer comprises tungsten formed by a substantially selective deposition process using tungsten hexafluoride and hydrogen as reactant gases.

19. The method of claim 16 wherein the layer comprises tungsten that is formed by a deposition process using tungsten hexafluoride and hydrogen as reactant gases, and forming the layer inside the trench to define the through-silicon via comprises:
depositing an outer portion of the layer with a silicon reduction reaction; and
depositing an inner portion of the layer with a hydrogen reduction reaction.

20. The method of claim 16 wherein the second average grain size is greater than the first average grain size.

* * * * *